(12) United States Patent
Kurooka et al.

(10) Patent No.: US 10,006,955 B2
(45) Date of Patent: Jun. 26, 2018

(54) SEMICONDUCTOR DEVICE AND ELECTRONIC CONTROL SYSTEM INCLUDING THE SAME

(71) Applicant: RENESAS ELECTRONICS CORPORATION, Tokyo (JP)

(72) Inventors: Kazuaki Kurooka, Tokyo (JP); Yasuo Morimoto, Tokyo (JP); Yoshihiro Funato, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/402,660

(22) Filed: Jan. 10, 2017

(65) Prior Publication Data

US 2017/0205458 A1 Jul. 20, 2017

(30) Foreign Application Priority Data

Jan. 14, 2016 (JP) ................. 2016-004864

(51) Int. Cl.
*G01R 31/00* (2006.01)
*G01R 31/02* (2006.01)
(Continued)

(52) U.S. Cl.
CPC ............ *G01R 31/025* (2013.01); *G01D 5/12* (2013.01); *H02H 7/0833* (2013.01); *H02P 6/12* (2013.01); *H03F 3/45071* (2013.01); *H03F 3/45475* (2013.01); *H03K 3/017* (2013.01); *H03F 2200/129* (2013.01); *H03F 2200/231* (2013.01); *H03F 2200/234* (2013.01); *H03F 2200/261* (2013.01); *H03F 2203/45116* (2013.01); *H03F 2203/45138* (2013.01); *H03F 2203/45171* (2013.01); *H03F 2203/45528* (2013.01)

(58) Field of Classification Search
CPC .......... G01D 5/12; H02H 7/0833; H02P 6/12; H03F 3/45071; H03F 3/45475; H03K 3/017; G01R 31/025
USPC ................................... 318/490, 563
See application file for complete search history.

(56) References Cited

U.S. PATENT DOCUMENTS 5,859,757 A * 1/1999 Hanafusa ............... G05F 1/575
361/100
2009/0179605 A1* 7/2009 Kanekawa ............... G01D 5/20
318/490

FOREIGN PATENT DOCUMENTS

| JP | 2009-162670 A | 7/2009 |
| JP | 2015-094718 A | 5/2015 |
| JP | 2015094718 A * | 5/2015 |

* cited by examiner

*Primary Examiner* — Jorge L Carrasquillo
(74) *Attorney, Agent, or Firm* — McDermott Will & Emery LLP

(57) ABSTRACT

According to one embodiment, a semiconductor device includes external terminals supplied with the pair of voltage signals based on a detection result of a resolver through first and second input resistances, respectively, an operation amplifier configured to amplify a potential difference between the pair of the voltage signals supplied to the external terminals, a feedback resistance disposed between an output terminal of the operation amplifier and one of two input terminals thereof, switches disposed between the two input terminals of the operation amplifier and the external terminals, respectively, and a short-circuit failure detection circuit configured to detect whether or not a short-circuit failure has occurred in the resolver based on a voltage level of each of the external terminals in a state where the switches are in an off-state.

11 Claims, 12 Drawing Sheets

(51) Int. Cl.
  *G01D 5/12* (2006.01)
  *H02H 7/08* (2006.01)
  *H02P 6/12* (2006.01)
  *H03F 3/45* (2006.01)
  *H03K 3/017* (2006.01)

SEMICONDUCTOR DEVICE AND ELECTRONIC CONTROL SYSTEM INCLUDING THE SAME

CROSS-REFERENCE TO RELATED APPLICATIONS

This application is based upon and claims the benefit of priority from Japanese patent application No. 2016-004864, filed on Jan. 14, 2016, the disclosure of which is incorporated herein in its entirety by reference.

BACKGROUND

The present invention relates to a semiconductor device and an electronic control system including the same. For example, the present invention relates to a semiconductor device and an electronic control system including the same suitable for accurately detecting the presence/absence of a short-circuit failure in a resolver by using a potential of an existing external terminal provided on a chip on which an RD converter is formed.

A vehicle such as a car is equipped with an electronic control system that detects a rotation angle of a rotating object such as a rotor and performs a predetermined process based on the detection result. The electronic control system includes a resolver that detects the rotation angle of the rotating object and an RD (Resolver to Digital) converter that converts a detection result of the resolver into a digital signal. Further, the electronic control system includes a failure detection circuit that detects (i.e., determines) whether or not a power-line short-circuit failure in which the resolver is short-circuited with a power-supply voltage side has occurred, and whether or not a ground-line short-circuit failure in which the resolver is short-circuited with a ground voltage side has occurred.

Japanese Unexamined Patent Application Publications No. 2015-94718 and No. 2009-162670 discloses related arts. In particular, Japanese Unexamined Patent Application Publications No. 2015-94718 discloses a configuration of a position detection device having a detection function of detecting the presence/absence of a disconnection in a wiring line. Further, Japanese Unexamined Patent Application Publications No. 2009-162670 discloses a configuration of a resolver failure detection device that detects a failure in a resolver.

SUMMARY

Incidentally, the RD converter includes an amplifier circuit for amplifying the detection result of the resolver, and it has been required that the gain of the amplifier circuit can be arbitrarily adjusted according to the type and the design specifications of the resolver. To that end, for example, an input resistance, which is used together with a feedback resistance to determine the gain of the amplifier circuit, is disposed outside of the RD converter chip so that the input resistance can be replaced and the gain of the amplifier circuit can be thereby adjusted.

It should be noted that, in order to prevent the number of external terminals disposed on the chip on which the RD converter is formed from being increased, it is conceivable to use a method in which the presence/absence (or the occurrence/non-occurrence) of a short-circuit failure in the resolver is detected by using a potential of an existing external terminal used for the RD converter without providing a dedicated external terminal to which the potential of the resolver is directly supplied. However, there is a problem in this method that due to the influence of the input resistance disposed outside the chip, the potential of the resolver cannot be accurately detected and, as a result, the presence/absence of a short-circuit failure in the resolver cannot be accurately detected. Other objects and novel features will be more apparent from the following description in the specification and the accompanying drawings.

According to one embodiment, a semiconductor device includes: first and second external terminals to which one of a pair of voltage signals and the other of the pair of voltage signals are supplied through first and second input resistances, respectively, the pair of voltage signals being signals that change according to a detection result of an externally-provided detection device; an operation amplifier configured to amplify a potential difference between the pair of the voltage signals supplied to the first and second external terminals; a first feedback resistance disposed between an output terminal of the operation amplifier and one of two input terminals thereof; first and second switches disposed between the two input terminals of the operation amplifier and the first and second external terminals, respectively; and a short-circuit failure detection circuit configured to detect whether or not a short-circuit failure has occurred in the detection device based on a voltage level of each of the first and second external terminals in a state where the first and second switches are in an off-state.

According to another embodiment, a semiconductor device includes: a first external terminal to which a voltage signal is supplied through a first input resistance, the voltage signal being a signal that changes according to a detection result of an externally-provided detection device; an operation amplifier configured to amplify the voltage signal supplied to the first external terminal; a first feedback resistance disposed between an output terminal of the operation amplifier and one of two input terminals thereof; a first switch disposed between the operation amplifier and the first external terminal; and a short-circuit failure detection circuit configured to detect whether or not a short-circuit failure has occurred in the detection device based on a voltage level of the first external terminal in a state where the first switch is in an off-state.

According to another embodiment, a semiconductor device includes: first and second external terminals; a first switch, one end of the first switch being connected to the first external terminal; a second switch, one end of the second switch being connected to the second external terminal; an operation amplifier including a first input terminal connected to another end of the first switch and a second input terminal connected to another end of the second switch; a feedback resistance disposed between an output terminal of the operation amplifier and the another end of the first switch; and an abnormality detection circuit configured to detect an abnormality of a signal supplied to the first external terminal based on a voltage level of the signal supplied to the first external terminal in a period in which the first switch is in an off-state.

According to the embodiment, it is possible to provide a semiconductor device and an electronic control system including the same capable of accurately detecting the presence/absence (or the occurrence/non-occurrence) of a short-circuit failure in a resolver by using a potential of an existing external terminal provided on a chip on which an RD converter is formed.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiments are explained hereinafter with reference to the drawings. It should be noted that the drawings are made in a simplified manner, and therefore the technical scope of the embodiments should not be narrowly interpreted based on those drawings. Further, the same components are assigned the same symbols and their duplicated explanations are omitted.

In the following embodiments, when necessary, the present invention is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may be also used.

Further, in the following embodiments, their components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the likes that are substantially similar to or resemble that shape are also included in that shape except for cases where it is explicitly specified or they are eliminated based on its principle. This is also true for the above-described numbers or the like (including numbers, values, quantities, ranges, and the like).

<Preliminary Examination by Inventors>

Before explaining details of an RD converter and an electronic control system including the same according to a first embodiment, an RD converter 50 and an electronic control system 5 including the RD converter 50 for which the inventors have made preliminary examinations are explained.

Figure 10:
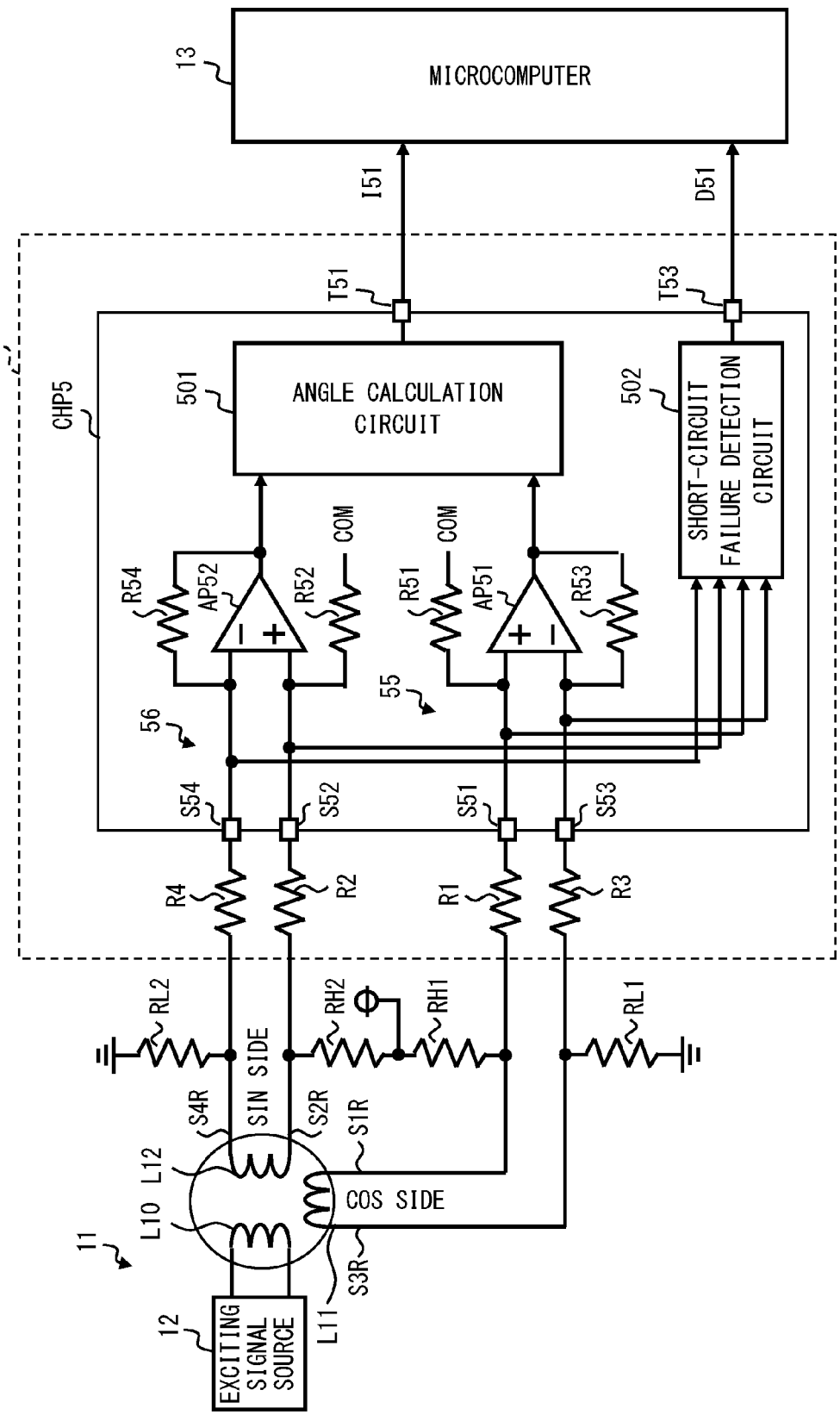
FIG. 10 shows a configuration example of an electronic control system according to an idea prior to achieving an embodiment.

FIG. 10 shows a configuration example of an electronic control system 5 according to an idea prior to achieving an embodiment. The electronic control system 5 is installed in, for example, a vehicle such as a car, and detects a rotation angle of a rotating object (an object to be detected) such as a rotor and performs a predetermined process based on the detection result. Further, the electronic control system 5 has a function of detecting the presence/absence (or the occurrence/non-occurrence) of a short-circuit failure in a resolver that detects the rotation angle of the rotating object.

Specifically, the electronic control system 5 includes a resolver (i.e., a detection device) 11 that detects a rotation angle of a rotor (not shown), an RD converter 50 that converts a detection result of the resolver 11 into a digital signal, and a microcomputer 13 that performs a predetermined process based on the digital signal output from the RD converter 50.

The resolver 11 includes, for example, an exciting signal source 12 and coils L10 to L12. The coils L10 to L12 are arranged so as to surround the rotor made of magnetic material. The exciting signal source 12 feeds an exciting signal having a sine-wave (hereinafter also expressed as a "sin-wave"), which is used as a carrier wave, (e.g., an exciting signal having a frequency of 10 kHz in this example) to the coil L10. This exciting signal is transferred to the coils L11 and L12 by electromagnetic induction and becomes carrier waves having phases different from each other by 90 degrees. Note that the amplitude of the carrier waves of the coils L11 and L12 changes according to the rotation angle of the rotor. That is, in the coils L11 and L12, signals containing information about the rotation angle of the rotor that are superimposed on the carrier waves appear as reception signals having phases different from each other by 90 degrees.

Specifically, a reception signal having a cosine-wave (hereinafter also expressed as a "cos-wave") is generated in one end S1R of the coil L11 and a reception signal having an opposite phase is generated in the other end S3R of the coil L11. Meanwhile, a reception signal having a sin-wave is generated in one end S2R of the coil L12 and a reception signal having an opposite phase is generated in the other end S4R of the coil L12.

The RD converter 50 is disposed on a chip CHP5 and includes external terminals S51 to S54, T51 to T53, operation amplifiers AP51 and AP52, feedback resistances R53 and R54, resistive elements R51 and R52, an angle calculation circuit 501, a short-circuit failure detection circuit 502, and input resistances R1-R4 disposed outside the chip CHP5. Note that the operational amplifier AP51, the input resistances R1 and R3, the resistive element R51, and the feedback resistance R53 constitute an amplifier circuit 55. The operational amplifier AP52, the input resistances R2 and R4, the resistive element R52, and the feedback resistance R54 constitute an amplifier circuit 56.

The amplifier circuit 55 amplifies the reception signal of the coil L11, which contains the rotation angle information. The amplifier circuit 56 amplifies the reception signal of the coil L12, which also contains the rotation angle information. In other words, the amplifier circuit 55 amplifies a potential difference between a pair of voltage signals output from both ends S1R and S3R of the coil L11. The amplifier circuit 56 amplifies a potential difference between a pair of voltage signals output from both ends S2R and S4R of the coil L12.

Specifically, the input resistance R1 is disposed between the end S1R of the coil L11 and the external terminal S51 outside the chip CHP5. The input resistance R2 is disposed between the ends S2R of the coil L12 and the external terminal S52. The input resistance R3 is disposed between the ends S3R of the coil L11 and the external terminal S53. The input resistance R4 is disposed between the ends S4R of the coil L12 and the external terminal S54.

Further, on the chip CHP5, a non-inverting input terminal of the operational amplifier AP51 is connected to the external terminal S51 and an inverting input terminal of the operational amplifier AP51 is connected to the external terminal S53. Further, an output terminal of the operational amplifier AP51 is connected to the inverting input terminal thereof through the feedback resistance R53. Further, a common voltage COM is supplied to the non-inverting input terminal of the operational amplifier AP51 through the resistive element R51. A non-inverting input terminal of the operational amplifier AP52 is connected to the external terminal S52 and an inverting input terminal of the operational amplifier AP52 is connected to the external terminal S54. Further, an output terminal of the operational amplifier AP52 is connected to the inverting input terminal thereof through the feedback resistance R54. Further, the common voltage COM is supplied to the non-inverting input terminal of the operational amplifier AP52 through the resistive element R52.

The common voltage COM has a voltage level that is higher than a reference voltage and lower than a power supply voltage. In this example, the common voltage COM is 2.5V, which is an intermediate voltage between the reference voltage of 0V and the power supply voltage of 5V. Therefore, the amplitude-center voltage of the voltage signals input to the amplifier circuits 55 and 56 is 2.5V, which is the common voltage COM.

It should be noted that in this example, among the input resistances R1 and R3 and the feedback resistance R53, by which the gain of the amplifier circuit 55 is determined, the input resistances R1 and R3 are disposed outside the chip CHP5 on the circuit board so that they can be replaced. In this way, the gain of the amplifier circuit 55 can be arbitrarily adjusted according to the type and the design specifications of the resolver. Similarly, among the input resistances R2 and R4 and the feedback resistance R54, by which the gain of the amplifier circuit 56 is determined, the input resistances R2 and R4 are disposed outside the chip CHP5 on the circuit board so that they can be replaced. In this way, the gain of the amplifier circuit 56 can be arbitrarily adjusted according to the type and the design specifications of the resolver.

Further, in the example shown in FIG. 10, resistive elements RH1, RH2, RL1 and RL2 are provided to detect a disconnection in the coils L11 and L12.

Specifically, the resistive element RH1 is disposed between a node on a signal line between the one end S1R of the coil L11 and the external terminal S51 and a power supply voltage terminal through which a power supply voltage (5V in this example) is supplied. The resistive element RL1 is disposed between a node on a signal line between the other end S3R of the coil L11 and the external terminal S53 and a reference voltage terminal through which a reference voltage (0V in this example) is supplied. The resistive element RH2 is disposed between a node on a signal line between the one end S2R of the coil L12 and the external terminal S52 and the power supply voltage terminal through which the power supply voltage (5V in this example) is supplied. The resistive element RL2 is disposed between a node on a signal line between the other end S4R of the coil L12 and the external terminal S54 and the reference voltage terminal through which the reference voltage (0V in this example) is supplied.

Note that the resistance values of the resistive elements RH1, RH2, RL1 and RL2 are adjusted so that they have such a resistance ratio among them that the amplitude-center voltage of the coils L11 and L12 is equal to the common voltage COM in a normal state. Further, their resistance values are adjusted to resistance values sufficiently higher than those of the resistive elements R1 to R4 and R51 to R54.

The angle calculation circuit 501 converts the output signals (analog signals) of the amplifier circuits 55 and 56, which contain the rotation angle information, into a digital signal 151 and outputs the digital signal 151. The microcomputer 13 performs a predetermined process based on the digital signal 151. Note that the microcomputer 13 may be disposed on the chip CHP5.

The short-circuit failure detection circuit 502 detects (i.e., determines) whether or not a power-line short-circuit failure in which the resolver 11 is short-circuited with a power-supply voltage side has occurred, and whether or not a ground-line short-circuit failure in which the resolver 11 is short-circuited with a reference voltage side has occurred. Further, the short-circuit failure detection circuit 502 outputs a result of the detection as a detection result D51. When the microcomputer 13 determines that a short-circuit failure has occurred based on the detection result D51, the microcomputer 13 performs a process for stopping the operation of the resolver 11 or the like. It should be noted, in this example, in order to prevent the number of external terminals disposed on the chip CHP5 from being increased, the presence/absence of a short-circuit failure in the resolver 11 is detected by using the potentials of the existing external terminals S51 to S54 disposed on the chip CHP5 on which the RD converter 50 is formed without providing a dedicated external terminal to which the potential of the resolver 11 is directly supplied.

However, there is a problem in the configuration shown in FIG. 10 that due to the influence of the input resistances disposed outside the chip, the potential of the resolver 11 cannot be accurately detected and, as a result, the presence/absence of a short-circuit failure in the resolver 11 cannot be accurately detected.

Figure 11:
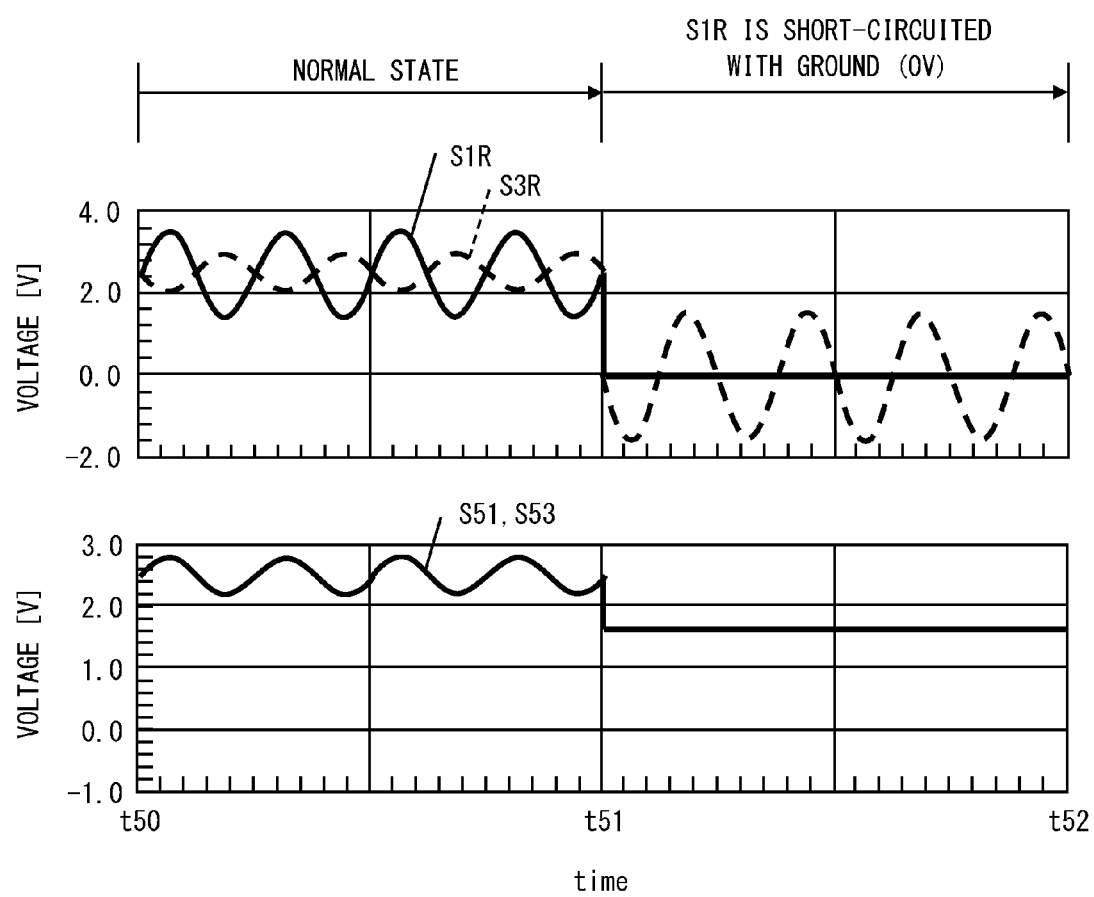
FIG. 11 is a timing chart showing an operation of the electronic control system shown in FIG. 10 in a ground-line short-circuit state.

FIG. 11 is a timing chart showing an operation of the electronic control system 5 in a ground-line short-circuit state. In the example shown in FIG. 11, potentials of the ends S1R and S3R of the coil L11 are shown in a timing chart drawn on the upper side of the figure and potentials of the external terminals S51 and S53 are shown in a timing chart drawn on the lower side of the figure. Note that the relation among the potentials of the ends S2R and S4R of the coil L12 and the external terminals S52 and S54 are fundamentally similar to the relation among the potentials of the ends S1R and S3R of the coil L11 and the external terminals S51 and S53, except that their phases are opposite. Therefore, their explanations are omitted.

As shown in FIG. 11, in a normal state (time t50 to t51), the potentials of the ends S1R and S3R of the coil L11 exhibit sin-waves with their amplitude-center potentials being about 2.5V. In this state, the potentials of the external terminals S51 and S53 also exhibit sin-waves with their amplitude-center potentials being about 2.5V.

After that, when the end S1R of the coil L11 is short-circuited with the ground (time t51), the potential of the end S1R is fixed to 0V (time t51 to t52). In contrast to this, the potential of the external terminal S51, which corresponds to the end S1R, is not fixed to 0V but does have an intermediate potential according to the resistance values of the resistive elements R51 and R1 (time t51 to t52). In the example shown in FIG. 11, the potential of the external terminal S51 in the ground-line short-circuit state is about 1.6V. However, it could change due to the influence of the resistance ratio between the resistive elements R51 and R1, variations of the resistive element R51, and the like. Therefore, it is very difficult to appropriately set the threshold voltage that is used for the determination of whether or not the end S1R is in the ground-line short-circuit state in the external terminal S51. Similarly, it is very difficult to appropriately set the threshold voltage that is used for the determination of whether or not the end S3R is in the ground-line short-circuit state in the external terminal S53. That is, there has been a problem in the electronic control system 5 that the ground-line short-circuit failure in the resolver 11 cannot be accurately detected by using the potentials of existing external terminals of the chip CHP5 on which the RD converter 50 is formed.

Figure 12:
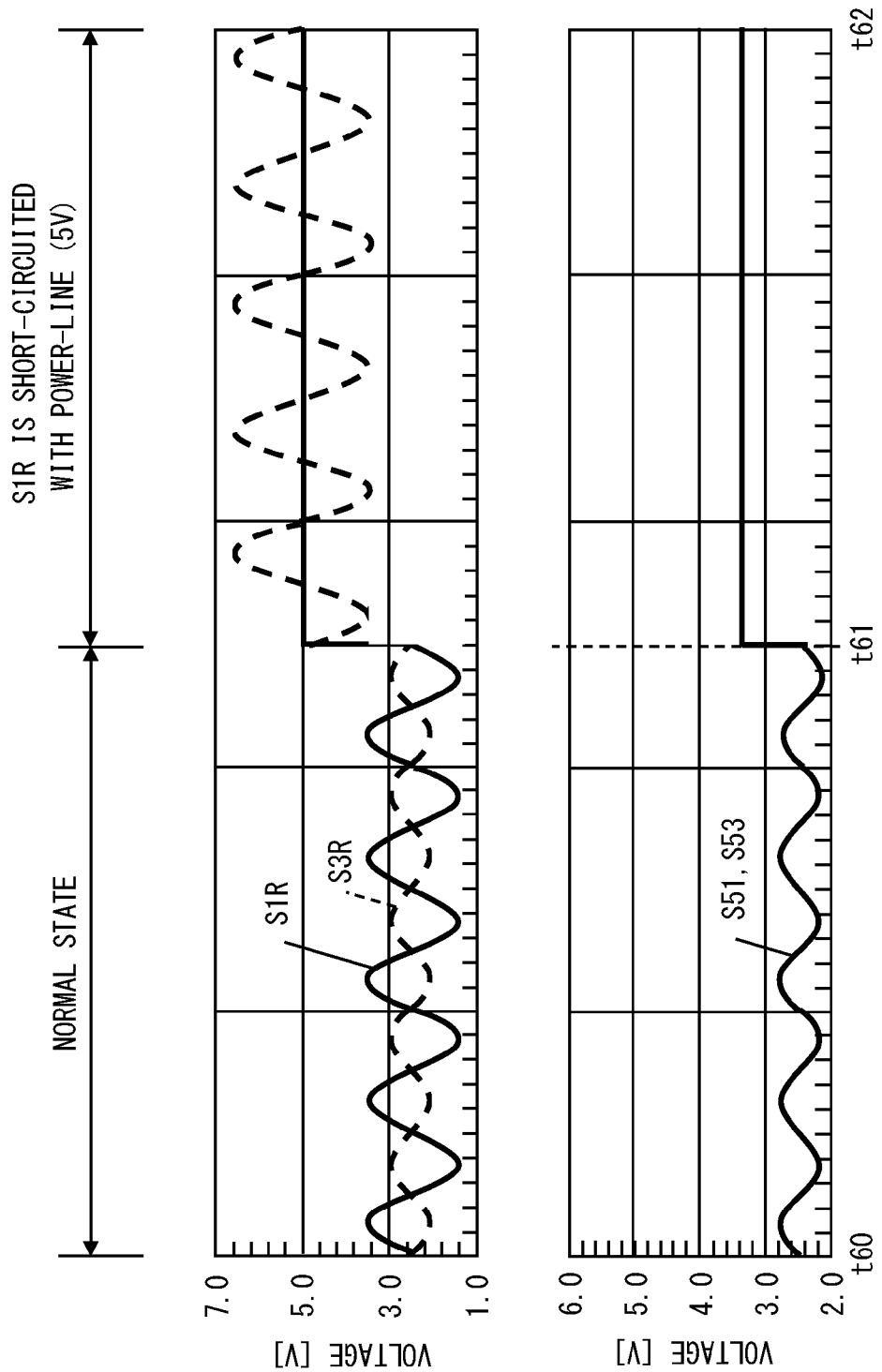
FIG. 12 is a timing chart showing an operation of the electronic control system shown in FIG. 10 in a power-line short-circuit state.

FIG. 12 is a timing chart showing an operation of the electronic control system 5 in a power-line short-circuit state. In the example shown in FIG. 12, potentials of the ends S1R and S3R of the coil L11 are shown in a timing chart drawn on the upper side of the figure and potentials of the external terminals S51 and S53 are shown in a timing chart drawn on the lower side of the figure. Note that the relation among the potentials of the ends S2R and S4R of the coil L12 and the external terminals S52 and S54 are fundamentally similar to the relation among the potentials of the ends S1R and S3R of the coil L11 and the external terminals S51 and S53, except that their phases are opposite. Therefore, their explanations are omitted.

As shown in FIG. 12, in a normal state (time t60 to t61), the potentials of the ends S1R and S3R of the coil L11 exhibit sin-waves with their amplitude-center potentials being about 2.5V. In this state, the potentials of the external terminals S51 and S53 also exhibit sin-waves with their amplitude-center potentials being about 2.5V.

After that, when the end S1R of the coil L11 is short-circuited with the power line (time t61), the potential of the end S1R is fixed to 5V (time t61 to t62). In contrast to this, the potential of the external terminal S51, which corresponds to the end S1R, is not fixed to 5V but does have an intermediate potential according to the resistance values of the resistive elements R51 and R1 (time t61 to t62). In the example shown in FIG. 12, the potential of the external terminal S51 in the power-line short-circuit state is about 3.3V. However, it could change due to the influence of the resistance ratio between the resistive elements R51 and R1, variations of the resistive element R51, and the like. Therefore, it is very difficult to appropriately set the threshold voltage that is used for the determination of whether or not the end S1R is in the power-line short-circuit state in the external terminal S51. Similarly, it is very difficult to appropriately set the threshold voltage that is used for the determination of whether or not the end S3R is in the power-line short-circuit state in the external terminal S53. That is, there has been a problem in the electronic control system 5 that the power-line short-circuit failure in the resolver 11 cannot be accurately detected by using the potentials of existing external terminals of the chip CHP5 on which the RD converter 50 is formed.

Note that if a dedicated external terminal to which the potential of the end S1R or S3R is directly supplied is disposed in the chip CHP5, the potential of this dedicated external terminal is fixed at 0V or 5V in a state where a short-circuit failure occurs in the end S1R or S3R. Therefore, it is possible to appropriate set the threshold voltage that is used for the determination of whether or not the end S1R or S3R is in a short-circuit state in this dedicated external terminal. However, in this case, the number of external terminals in the chip CHP5 increases and hence the circuit size could increase.

Therefore, we have found an RD converter 10 and an electronic control system 1 including the RD converter 10 according to a first embodiment so that the presence/absence (or the occurrence/non-occurrence) of a short-circuit failure in the resolver 11 can be accurately detected by using a potential(s) of an existing external terminal(s) disposed on a chip on which the RD converter is formed.

First Embodiment

Figure 1:
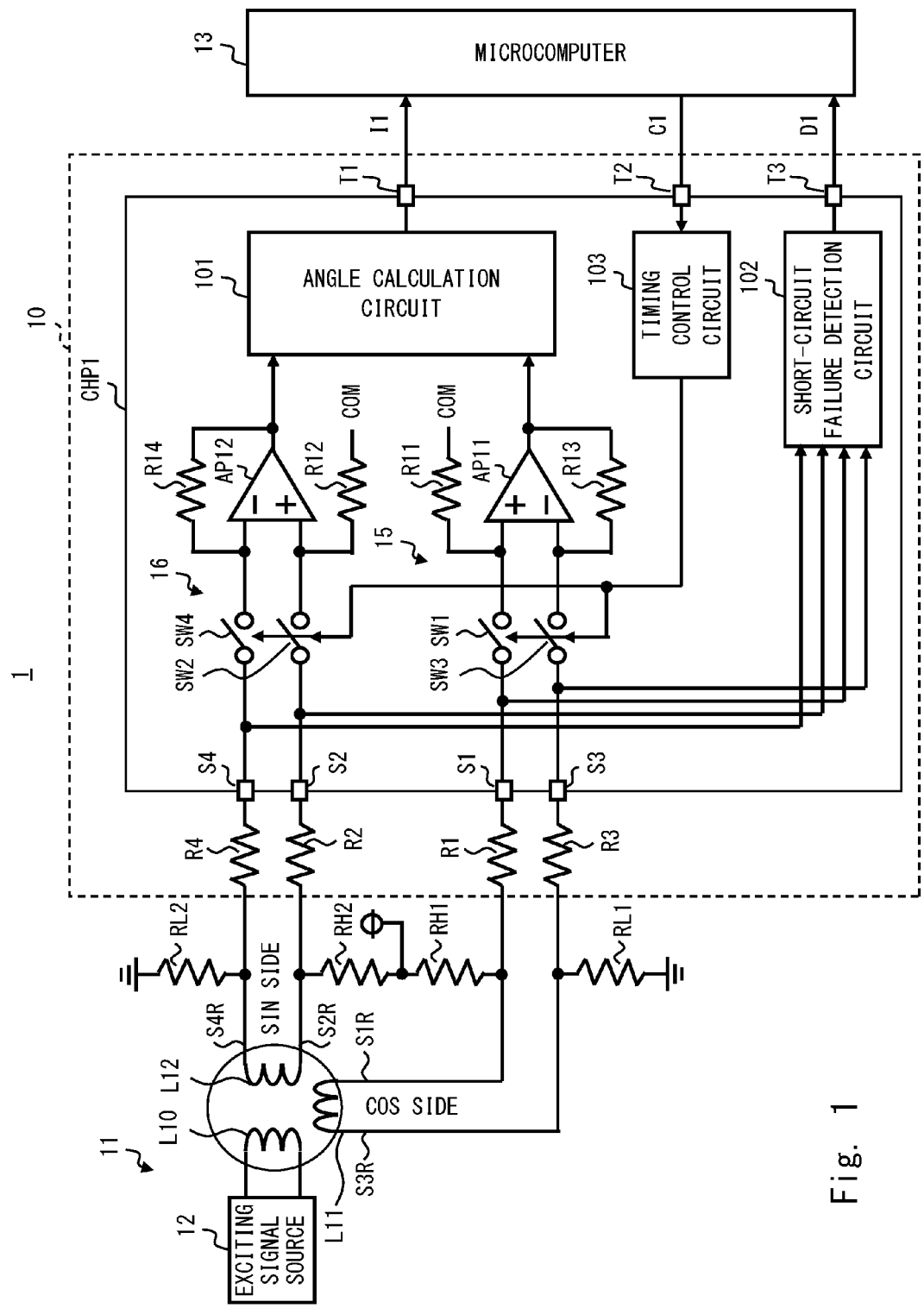
FIG. 1 shows a configuration example of an electronic control system according to a first embodiment.

FIG. 1 shows a configuration example of an electronic control system 1 according to a first embodiment. The electronic control system 1 is installed in, for example, a vehicle such as a car, and detects a rotation angle of a rotating object (an object to be detected) such as a rotor and performs a predetermined process based on the detection result. Further, the electronic control system 1 has a function of accurately detecting the presence/absence of a short-circuit failure in a resolver by using a potential(s) of an existing external terminal(s) disposed in a chip on which an RD converter is formed. The electronic control system 1 is explained hereinafter in detail.

Specifically, the electronic control system 1 includes a resolver (i.e., a detection device) 11 that detects a rotation angle of a rotor (not shown), an RD converter 10 that converts a detection result of the resolver 11 into a digital signal, and a microcomputer 13 that performs a predetermined process based on the digital signal output from the RD converter 10. All the components of the electronic control system 1, except for the RD converter 10, have already been explained above. Therefore, the RD converter 10 is mainly explained hereinafter.

The RD converter 10 includes external terminals S1 to S4 and T1 to T3 disposed on a chip CHP1, operational amplifiers AP11 and AP12, feedback resistances R13 and R14, resistive elements R11 and R12, switches SW1 to SW4, an angle calculation circuit 101, a short-circuit failure detection circuit (an abnormality detection circuit) 102, a timing control circuit 103, and input resistances R1 to R4 disposed outside the chip CHP1. Note that the operational amplifier AP11 and the resistive elements R1, R3, R11 and R13 constitute an amplifier circuit 15. The operational amplifier AP12 and the resistive elements R2, R4, R12 and R14 constitute an amplifier circuit 16.

The amplifier circuit 15 amplifies the reception signal of the coil L11, which contains the rotation angle information. The amplifier circuit 16 amplifies the reception signal of the coil L12, which also contains the rotation angle information.

In other words, the amplifier circuit 15 amplifies a potential difference between a pair of voltage signals output from both ends S1R and S3R of the coil L11. The amplifier circuit 16 amplifies a potential difference between a pair of voltage signals output from both ends S2R and S4R of the coil L12.

Specifically, the input resistance R1 is disposed between the end S1R of the coil L11 and the external terminal S1 outside the chip CHP1. The input resistance R2 is disposed between the ends S2R of the coil L12 and the external terminal S2. The input resistance R3 is disposed between the ends S3R of the coil L11 and the external terminal S3. The input resistance R4 is disposed between the ends S4R of the coil L12 and the external terminal S4.

Further, the switch SW1 is disposed between a non-inverting input terminal of the operational amplifier AP11 and the external terminal S1 on the chip CHP1. The switch SW3 is disposed between an inverting input terminal of the operational amplifier AP11 and the external terminal S3. The feedback resistance R13 is disposed between an output terminal of the operational amplifier AP11 and the inverting input terminal thereof. Further, a common voltage COM is supplied to the non-inverting input terminal of the operational amplifier AP11 through the resistive element R11. The switch SW2 is disposed between a non-inverting input terminal of the operational amplifier AP12 and the external terminal S2. The switch SW4 is disposed between an inverting input terminal of the operational amplifier AP12 and the external terminal S4. The feedback resistance R14 is disposed between an output terminal of the operational amplifier AP12 and the inverting input terminal thereof. Further, the common voltage COM is supplied to the non-inverting input terminal of the operational amplifier AP12 through the resistive element R12.

The common voltage COM has a voltage level that is higher than a reference voltage and lower than a power supply voltage. In this example, the common voltage COM is 2.5V, which is an intermediate voltage between the reference voltage of 0V and the power supply voltage of 5V. Therefore, the amplitude-center voltage of the voltage signals input to the amplifier circuits 15 and 16 is 2.5V, which is the common voltage COM. Note that the common voltage COM can be changed as appropriate according to the design specifications and the like.

Figure 3:
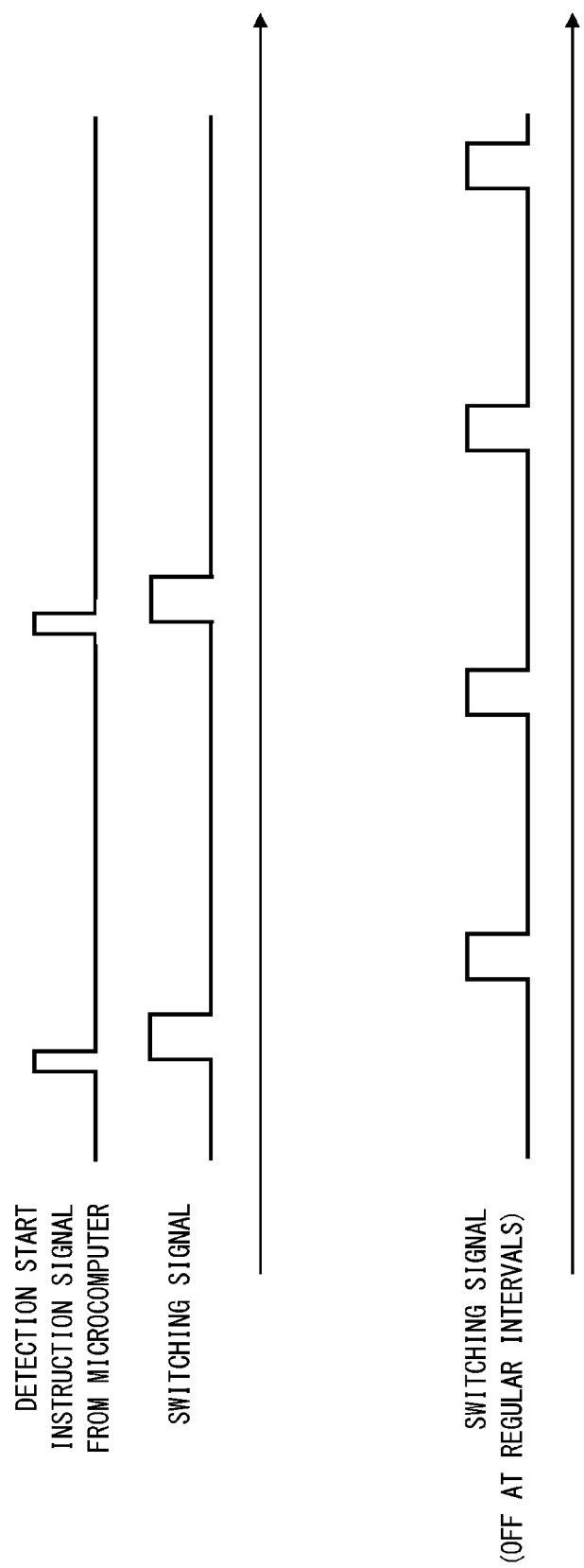
FIG. 3 shows an example of waveforms of a switching signal for switching of an on/off state of a switch.

The on/off states of the switches SW1 to SW4 are controlled by a switching signal(s) supplied from the timing control circuit 103. For example, the switches SW1 to SW4 are all controlled to the off-state in a period in which the detection of a short-circuit failure is performed. Further, the switches SW1 to SW4 are all controlled to the on-state in a period in which a normal operation is performed. Note that as shown in FIG. 3, the detection of a short-circuit failure may be performed according to an instruction C1 from the microcomputer 13 or may be performed at regular intervals.

It should be noted that in this embodiment, among the input resistances R1 and R3 and the feedback resistance R13, by which the gain of the amplifier circuit 15 is determined, the input resistances R1 and R3 are disposed outside the chip CHP1 on the circuit board so that they can be replaced. In this way, the gain of the amplifier circuit 15 can be arbitrarily adjusted according to the type, the design specifications, and the like of the resolver. Similarly, among the input resistances R2 and R4 and the feedback resistance R14, by which the gain of the amplifier circuit 16 is determined, the input resistances R2 and R4 are disposed outside the chip CHP1 on the circuit board so that they can be replaced. In this way, the gain of the amplifier circuit 16 can be arbitrarily adjusted according to the type, the design specifications, and the like of the resolver.

Further, in this embodiment, resistive elements RH1, RH2, RL1 and RL2 are provided to detect a disconnection in the coils L11 and L12.

Specifically, the resistive element RH1 is disposed between a node on a signal line between the one end S1R of the coil L11 and the external terminal S1 and a power supply voltage terminal through which a power supply voltage (5V in this example) is supplied. The resistive element RL1 is disposed between a node on a signal line between the other end S3R of the coil L11 and the external terminal S3 and a reference voltage terminal through which a reference voltage (0V in this example) is supplied. The resistive element RH2 is disposed between a node on a signal line between the one end S2R of the coil L12 and the external terminal S2 and the power supply voltage terminal through which the power supply voltage (5V in this example) is supplied. The resistive element RL2 is disposed between a node on a signal line between the other end S4R of the coil L12 and the external terminal S4 and the reference voltage terminal through which the reference voltage (0V in this example) is supplied.

Note that the resistance values of the resistive elements RH1, RH2, RL1 and RL2 are adjusted so that they have such a resistance ratio among them that the amplitude-center voltage of the coils L11 and L12 is equal to the common voltage COM in a normal state. Further, their resistance values are adjusted to resistance values sufficiently higher than those of the resistive elements R1 to R4 and R11 to R14.

The angle calculation circuit 101 converts the output signals (analog signals) of the amplifier circuits 15 and 16, which contain the rotation angle information, into a digital signal I1 and outputs the digital signal I1. The microcomputer 13 performs a predetermined process based on the digital signal I1. Note that the microcomputer 13 may be disposed on the chip CHP1.

(Specific Configuration Example of Angle Calculation Circuit 101)

Figure 2:
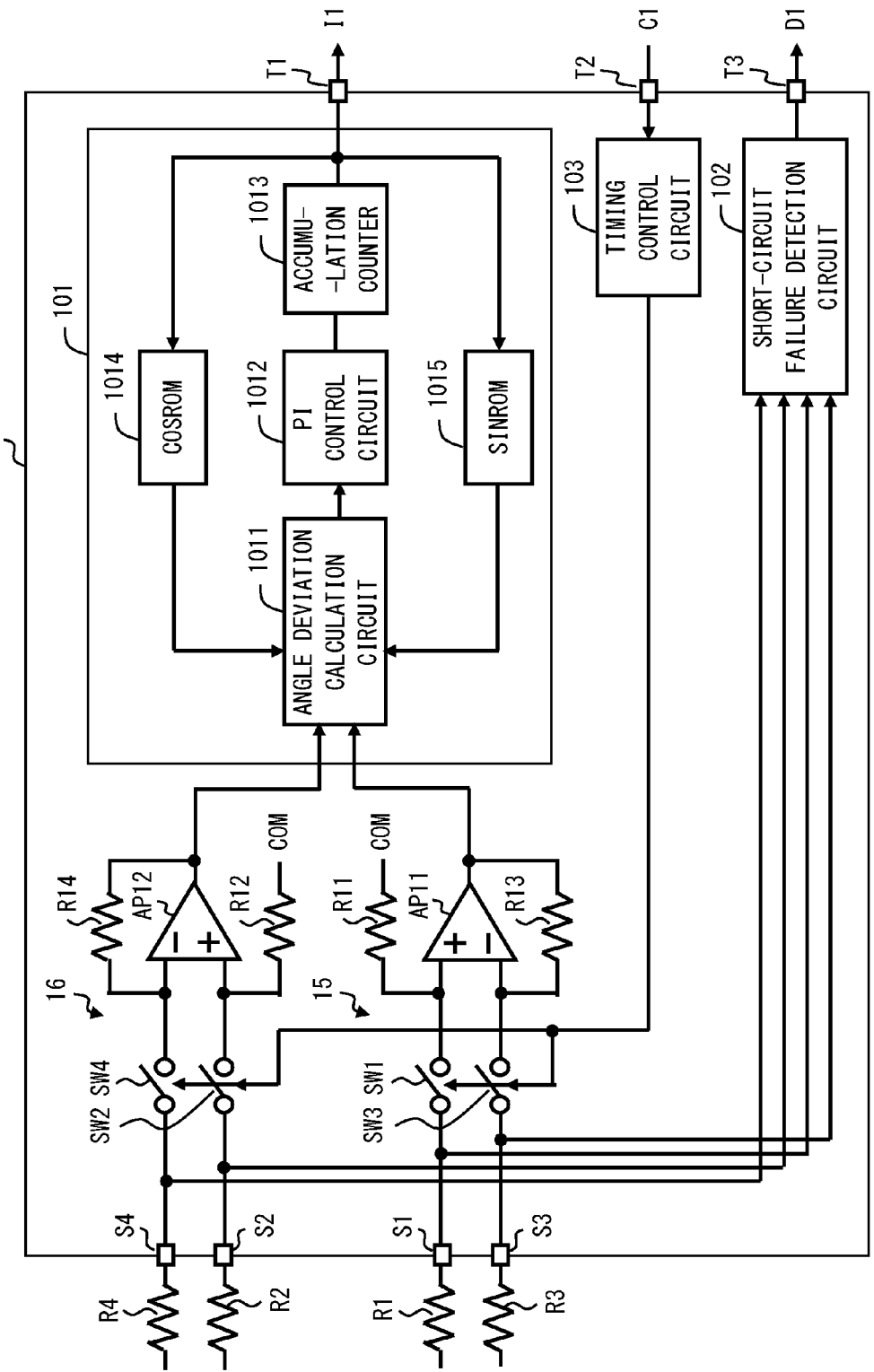
FIG. 2 shows a specific configuration example of an RD converter provided in the electronic control system shown in FIG. 1.

FIG. 2 shows a specific configuration example of the RD converter 10.

FIG. 2 also shows a specific configuration example of the angle calculation circuit 101.

As shown in FIG. 2, the angle calculation circuit 101 includes an angle deviation calculation circuit 1011, a PI (Proportion-Integral) control circuit 1012, an accumulation counter 1013, and ROMs 1014 and 1015.

The angle deviation calculation circuit 1011 outputs a control signal having a duty ratio that changes according to a difference between an angle $\varphi$ represented by the digital signal I1 output from the angle calculation circuit 101 and an angle $\theta$ detected by the resolver 11. For example, when the angle $\varphi$ is larger than the angle $\theta$, the angle deviation calculation circuit 1011 outputs an L-level control signal, whereas when the angle $\varphi$ is smaller than the angle $\theta$, the angle deviation calculation circuit 1011 outputs an H-level control signal. Therefore, when the angle $\varphi$ is equal to the angle $\theta$, the angle deviation calculation circuit 1011 outputs a control signal having a duty ratio of 50%.

More specifically, the angle deviation calculation circuit 1011 performs the below-shown Expression (1). In the expression: f(t) represents an exciting component; f(t)·cos $\theta$ represents a reception signal component of the coil L11; f(t)·sin $\theta$ represents a reception signal component of the coil L12; cos $\varphi$ represents a value that is read from the ROM 1014 based on the angle $\varphi$ represented by the digital signal I1; and sin φ represents a value that is read from the ROM 1015 based on the angle φ represented by the digital signal I1.

$$f(t)\cdot\sin\theta\cdot\cos\varphi - f(t)\cdot\cos\theta\cdot\sin\varphi = f(t)\cdot\sin(\theta-\varphi) \quad (1)$$
$$= f(t)\cdot(\theta-\varphi)$$
$$= f(t)\cdot\varepsilon$$

After that, the exciting component f(t) is removed by synchronous detection and the value of the control signal of the angle deviation calculation circuit 1011 becomes ε (=θ−φ).

The PI control circuit 1012 serves as the so-called "low-pass filter". That is, the PI control circuit 1012 removes high-frequency components form the control signal supplied from the angle deviation calculation circuit 1011 and outputs the resultant signal (i.e., the control signal from which high-frequency components are removed). The accumulation counter 1013 integrates the output signal of the PI control circuit 1012 and outputs the integrated signal as the digital signal I1. The angle φ represented by this digital signal I1 is fed back to the angle deviation calculation circuit 1011 as described above, thus forming a closed loop in which sin(θ−φ) is zero (sin(θ−φ)=0). This means that the angle calculation circuit 101 calculates the angle φ that satisfies the relation "θ=φ" and outputs the calculated angle φ as the digital signal I1.

Referring FIG. 1 again, the short-circuit failure detection circuit 102 detects (i.e., determines) whether or not a power-line short-circuit failure in which the resolver 11 is short-circuited with a power-supply voltage side has occurred, and whether or not a ground-line short-circuit failure in which the resolver 11 is short-circuited with a reference voltage side has occurred. Further, the short-circuit failure detection circuit 102 outputs a result of the detection as a detection result D1. When the microcomputer 13 determines that a short-circuit failure has occurred based on the detection result D1, the microcomputer 13 performs a process for stopping the operation of the resolver 11 or the like.

It should be noted, in order to prevent the number of external terminals disposed on the chip CHP1 from being increased, the short-circuit failure detection circuit 102 detects the presence/absence of a short-circuit failure in the resolver 11 by using potentials of the existing external terminals S1 to S4 disposed on the chip CHP1 on which the RD converter 10 is formed without using the potential of a dedicated external terminal.

Further, in a mode in which the detection of a short-circuit failure is performed (i.e., a short-circuit failure detection mode), all of the switches SW1 to SW4 are controlled to an off-state. Note that the length of one period during which the switches SW1 to SW4 are in an off-state is, for example, about 100 us. Accordingly, in the short-circuit failure detection mode, since the common voltage COM is not applied to the external terminals S1 to S4, an external terminal(s) that is connected to an end of a coil that is in a ground-line short-circuit state is fixed to about 0V and an external terminal(s) that is connected to an end of a coil that is in a power-line short-circuit state is fixed to about 5V. Therefore, it is possible to appropriately set the threshold voltage that is used for the determination of whether or not an end of a coil is in the ground-line short-circuit state in the external terminals S1 to S4. As a result, the short-circuit failure detection circuit 102 can accurately detect a short-circuit failure in the resolver 11 by using the potentials of the existing external terminals S1 to S4 of the chip CHP1 on which the RD converter 10 is formed.

(Timing Chart)

Figure 4:
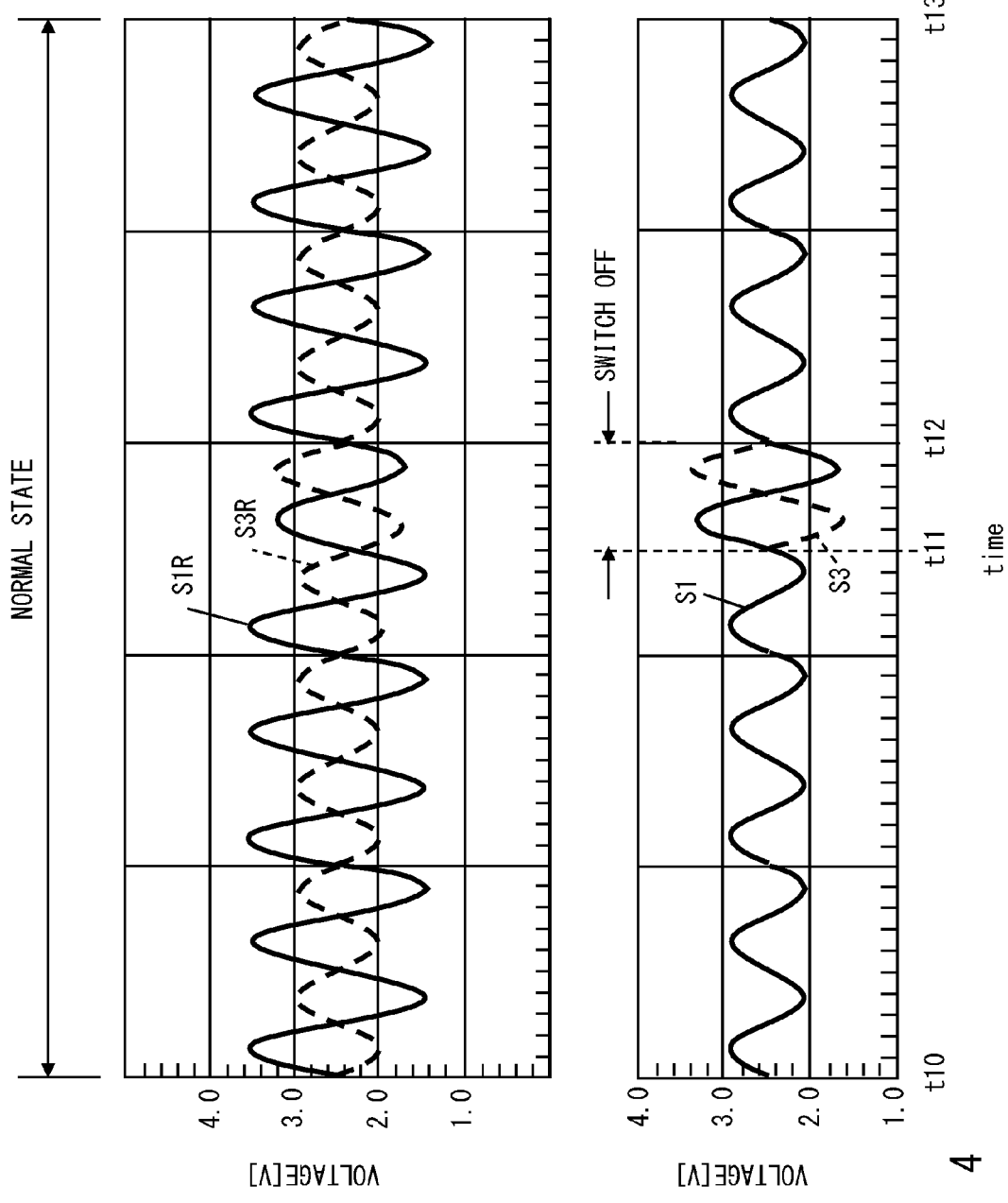
FIG. 4 is a timing chart showing an operation of the electronic control system shown in FIG. 1 in a normal state.
Figure 5:
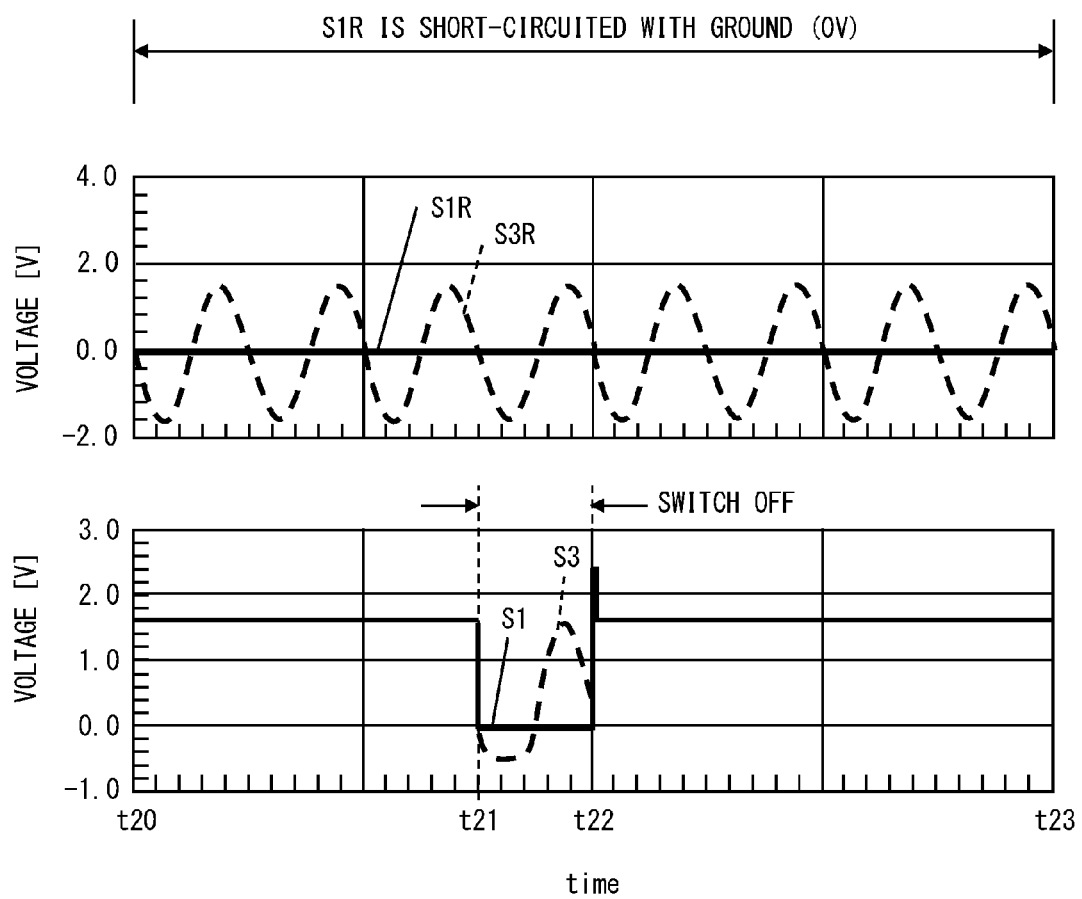
FIG. 5 is a timing chart showing an operation of the electronic control system shown in FIG. 1 in a ground-line short-circuit state.
Figure 6:
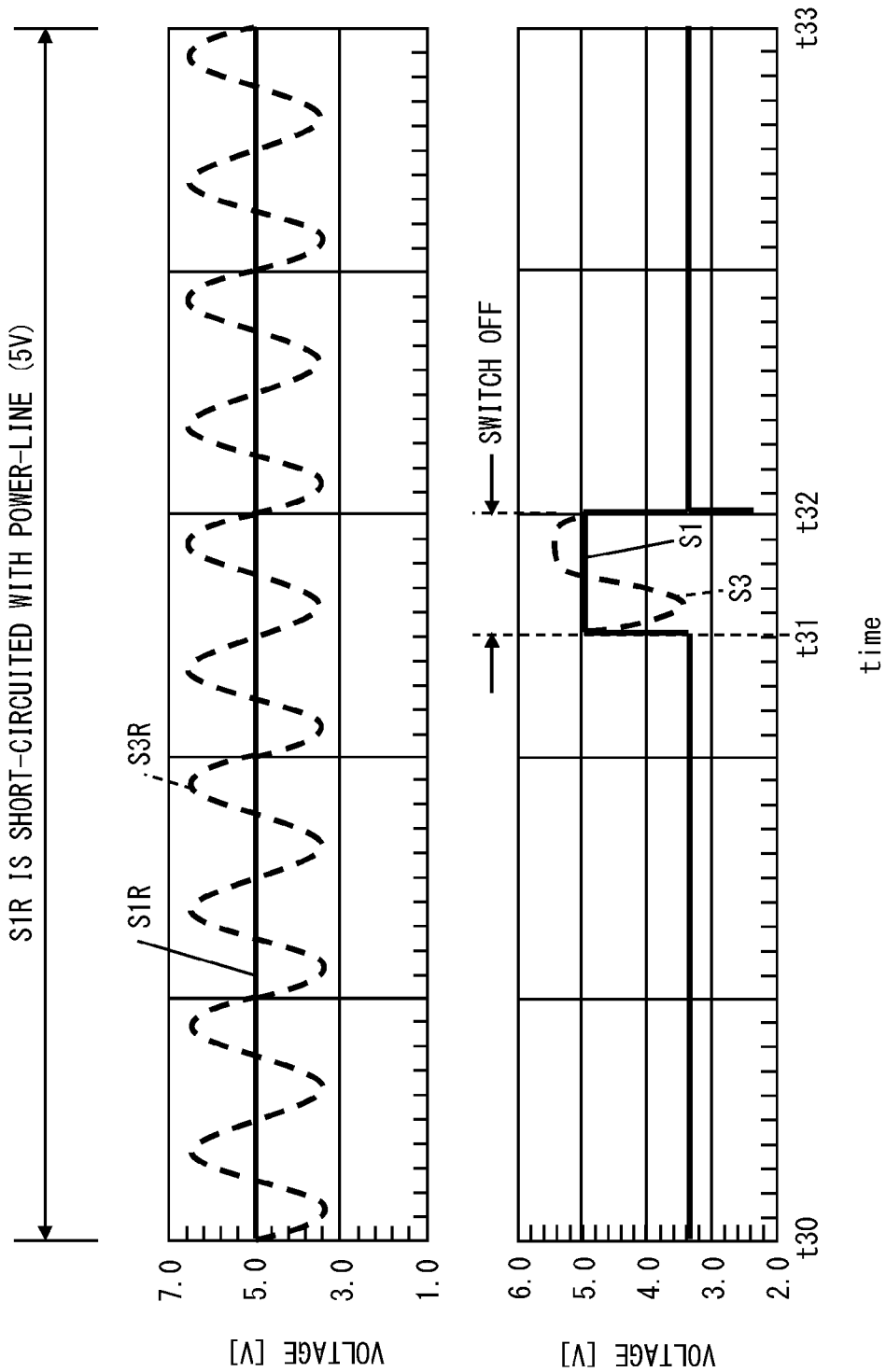
FIG. 6 is a timing chart showing an operation of the electronic control system shown in FIG. 1 in a power-line short-circuit state.

FIG. 4 is a timing chart showing an operation of the electronic control system 1 in a normal state. FIG. 5 is a timing chart showing an operation of the electronic control system 1 in a ground-line short-circuit state. FIG. 6 is a timing chart showing an operation of the electronic control system 1 in a power-line short-circuit state. In the example shown in FIGS. 4 to 6, potentials of the ends S1R and S3R of the coil L11 are shown in a timing chart drawn on the upper side of the figure and potentials of the external terminals S1 and S3 are shown in a timing chart drawn on the lower side of the figure. Note that the relation among the potentials of the ends S2R and S4R of the coil L12 and the external terminals S2 and S4 is fundamentally similar to the relation among the potentials of the ends S1R and S3R of the coil L11 and the external terminals S1 and S3, except that their phases are opposite. Therefore, their explanations are omitted.

Firstly, as shown in FIG. 4, in a normal state in which no short-circuit failure has occurred in the resolver 11, the potentials of the ends S1R and 53R of the coil L11 exhibit sin-waves with their amplitude-center potentials being about 2.5V in either of the normal operation mode in which the switches SW1 to SW4 are in an on-state (time t10 to t11, time t12 to t13) and the short-circuit failure detection mode in which the switches SW1 to SW4 are in an off-state (time t11 to t12). In this state, the potentials of the external terminals S1 and S3 also exhibit sin-waves with their amplitude-center potentials being about 2.5V.

Next, as shown in FIG. 5, in a state in which the end S1R of the coil L11 is short-circuited with the ground, the potential of the end S1R of the coil L11 is fixed to 0V in either of the normal operation mode (time t20 to t21, time t22 to t23) and the short-circuit failure detection mode (time t21 to t22). In contrast to this, although the potential of the external terminal S1, which corresponds to the end S1R, has an intermediate potential according to the resistance values of the resistive elements R11 and R1 in the normal operation mode (time t20 to t21, time t22 to t23), it is fixed to 0V in the short-circuit failure detection mode (time t21 to t22). Therefore, it is possible to appropriate set the threshold voltage that is used for the determination of whether or not the end S1R is in a ground-line short-circuit state in the external terminal S1 in the short-circuit failure detection mode. Similarly, it is possible to appropriate set the threshold voltage that is used for the determination of whether or not the end S3R is in a ground-line short-circuit state in the external terminal S3 in the short-circuit failure detection mode. Therefore, the electronic control system 1 can accurately detect a ground-line short-circuit failure in the resolver 11 by using the existing external terminals S1 and S3 of the chip CHP1 on which the RD converter 10 is formed.

Next, as shown in FIG. 6, in a state in which the end S1R of the coil L11 is short-circuited with the power-line, the potential of the end S1R of the coil L11 is fixed to 5V in either of the normal operation mode (time t30 to t31, time t32 to t33) and the short-circuit failure detection mode (time t31 to t32). In contrast to this, although the potential of the external terminal S1, which corresponds to the end S1R, has an intermediate potential according to the resistance values of the resistive elements R11 and R1 in the normal operation mode (time t30 to t31, time t32 to t33), it is fixed to 5V in the short-circuit failure detection mode (time t31 to t32).

Therefore, it is possible to appropriately set the threshold voltage that is used for the determination of whether or not the end S1R is in a power-line short-circuit state in the external terminal S1 in the short-circuit failure detection mode. Similarly, it is possible to appropriately set the threshold voltage that is used for the determination of whether or not the end S3R is in a power-line short-circuit state in the external terminal S3 in the short-circuit failure detection mode. Therefore, the electronic control system 1 can accurately detect a power-line short-circuit failure in the resolver 11 by using the existing external terminals S1 and S3 of the chip CHP1 on which the RD converter 10 is formed.

As described above, the RD converter 10 and the electronic control system 1 including the RD converter 10 according to this embodiment disconnect the external terminals S1 to S4 from the operational amplifiers AP11 and AP12 in the short-circuit failure detection mode and then detect the presence/absence of a short-circuit failure in the resolver 11 by using the potentials of the external terminals S1 to S4. As a result, the RD converter 10 and the electronic control system 1 including the RD converter 10 according to this embodiment can accurately detect the presence/absence of a short-circuit failure in the resolver 11 without using the potential of a dedicated external terminal and hence prevent an increase in the circuit size.

The embodiment is explained above by using an example case where the power supply voltage, the reference voltage, and the common voltage are 5V, 0V, and 2.5V, respectively. However, the power supply voltage, the reference voltage, and the common voltage can be changed to arbitrary voltages, provided that the common voltage is lower than the power supply voltage and higher than the reference voltage. This also holds true for other embodiments.

Further, the embodiment is explained above by using an example case where the resistive elements RH1, RH2, RL1 and RL2 are disposed outside the chip CHP1. Specifically, the embodiment is explained above by using the example case where the resistive elements RH1 and RH2 are disposed between the nodes on signal lines between the resolver 11 and the external terminals S1 and S2 and the power supply voltage terminal. The resistive elements RL1 and RL2 are disposed between the nodes on signal lines between the resolver 11 and the external terminals S3 and S4 and the reference voltage terminal. However, the arrangement of the resistive elements is not limited to this example. The resistive elements RH1, RH2, RL1 and RL2 may be disposed inside the chip CHP1. Specifically, the resistive elements RH1 and RH2 may be disposed between the nodes on signal lines between the external terminals S1 and S2 and the switches SW1 and SW2 and the power supply voltage terminal. The resistive elements RL1 and RL2 may be disposed between the nodes on signal lines between the external terminals S3 and S4 and the switches SW3 and SW4 and the reference voltage terminal. This also holds true for other embodiments.

Further, the embodiment is explained above by using an example case where the amplifier circuit disposed in the RD converter amplifies a potential difference between differential voltage signals that are supplied as a detection result of the detection device. However, the present invention is not limited to this example. The above-described configuration can be changed as appropriate to a configuration in which the amplifier circuit disposed in the RD converter amplifies a single-end voltage signal supplied as a detection result of the detection device. This also holds true for other embodiments.

(Modified Example of RD Converter 10)

Next, a modified example of the RD converter 10 is explained with reference to FIG. 7.

Figure 7:
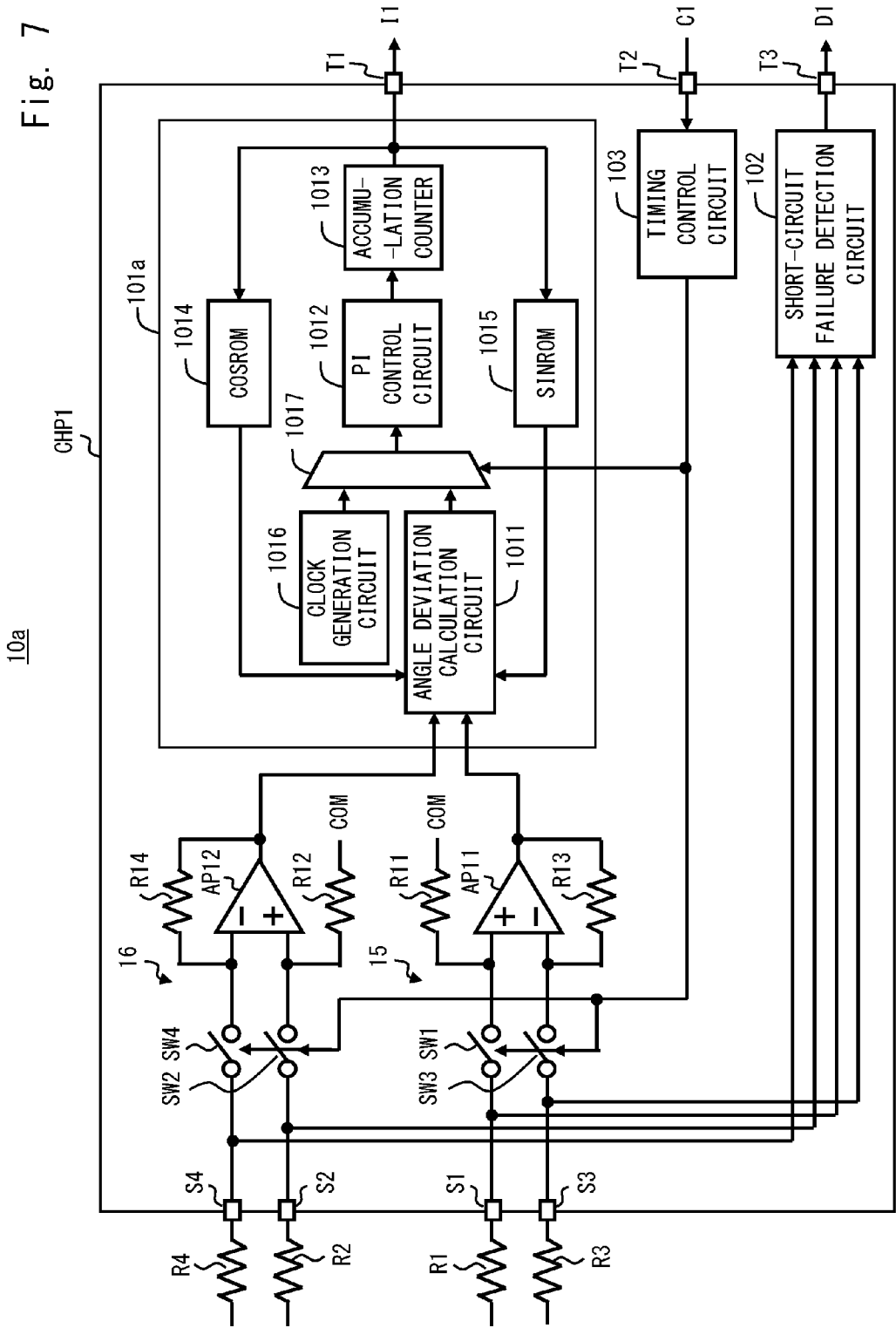
FIG. 7 shows a modified example of the RD converter shown in FIG. 2.

FIG. 7 shows an RD converter 10a which is a modified example of the RD converter 10.

As shown in FIG. 7, compared to the RD converter 10, the RD converter 10a includes an angle calculation circuit 101a in place of the angle calculation circuit 101. Compared to the angle calculation circuit 101, the angle calculation circuit 101a further includes a clock generation circuit 1016 and a selection circuit 1017. The rest of the RD converter 10a is similar to that of the RD converter 10 and therefore its explanation is omitted.

The clock generation circuit 1016 outputs a clock signal having a duty ratio of 50% as the control signal.

The selection circuit 1017 selects and outputs one of the output signal of the angle deviation calculation circuit 1011 and the output signal of the clock generation circuit 1016 based on the switching signal supplied from the timing control circuit 103. For example, in the normal operation mode, the selection circuit 1017 selects and outputs the output signal of the angle deviation calculation circuit 1011. Further, in the short-circuit failure detection mode, the selection circuit 1017 selects and outputs the output signal of the clock generation circuit 1016.

It should be noted that in the short-circuit failure detection mode, since the clock signal having the duty ratio of 50% is used as the control signal, the angle calculation circuit 101a determines that it is in a state that is similar to the state where the angle φ and the angle θ are equal to each other and thereby maintains the value of the digital signal I1 at the value immediately before the transition to the short-circuit failure detection mode. As a result, it is possible to prevent such situations that the value of the digital signal I1 output from the angle calculation circuit 101a is widely changed unintentionally or accidentally, or the tracking of the angle performed by the angle calculation circuit 101a becomes impossible in the short-circuit failure detection mode.

Note that the cycle of the clock signal of the clock generation circuit 1016 needs to be sufficiently short so that the stabled state of the digital signal I1 can be maintained. Specifically, the cycle of the clock signal is, for example, 2 us.

Second Embodiment

Figure 8:
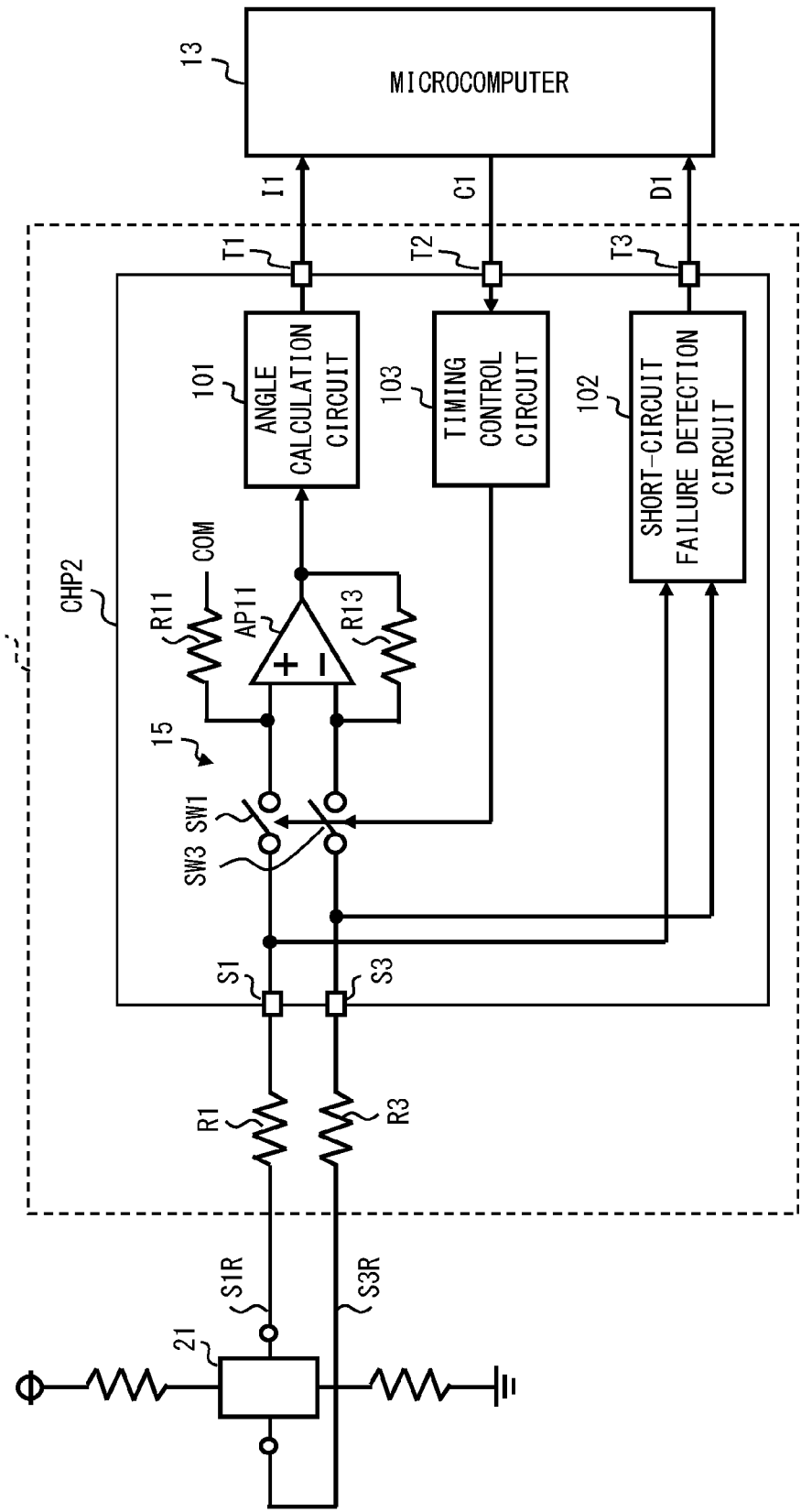
FIG. 8 shows a configuration example of an electronic control system according to a second embodiment.

FIG. 8 shows a configuration example of an electronic control system 2 according to a second embodiment.

The electronic control system 2 is an angle sensing system using a Hall sensor.

As shown in FIG. 8, the electronic control system 2 includes a Hall sensor (i.e., a detection device) 21, an AD converter 20, and a microcomputer 13. The Hall sensor 21 outputs voltage signals having amplitudes that change according to a rotation angle of a rotating object from its ends S1R and S3R. The AD converter 20 convers a detection result (an analog signal) of the Hall sensor 21 into a digital signal I1 and outputs the digital signal I1. Further, the AD converter 20 detects the presence/absence of a short-circuit failure in the Hall sensor 21 and outputs a result of the detection as a detection result D1. The microcomputer 13 performs a predetermined process based on the digital signal I1, which contains the angle information output from the AD converter 20. Further, when a short-circuit failure in the Hall sensor 21 is detected by the AD converter 20, the microcomputer 13 performs a process for stopping the operation of the Hall sensor 21 or the like.

The AD converter 20 includes, among all the components of the RD converter 10, an amplifier circuit 15, an angle calculation circuit 101, a short-circuit failure detection circuit 102, a timing control circuit 103, and switches SW1 and SW3. Note that a chip CHP2 corresponds to the chip CHP1. The operations of the AD converter 20 are basically similar to those of the amplifier circuit 15, the angle calculation circuit 101, the short-circuit failure detection circuit 102, the timing control circuit 103, and the switches SW1 and SW3 in the RD converter 10, and therefore their explanation is omitted.

The AD converter 20 and the electronic control system 2 including the AD converter 20 according to this embodiment disconnect the external terminals S1 and S3 from the operational amplifier AP11 in the short-circuit failure detection mode and then detect the presence/absence of a short-circuit failure in the Hall sensor 21 by using the potentials of the external terminals S1 and S3. As a result, the AD converter 20 and the electronic control system 2 including the AD converter 20 according to this embodiment can accurately detect the presence/absence of a short-circuit failure in the Hall sensor 21 without using the potential of a dedicated external terminal and hence prevent the increase in the circuit size.

Third Embodiment

Figure 9:
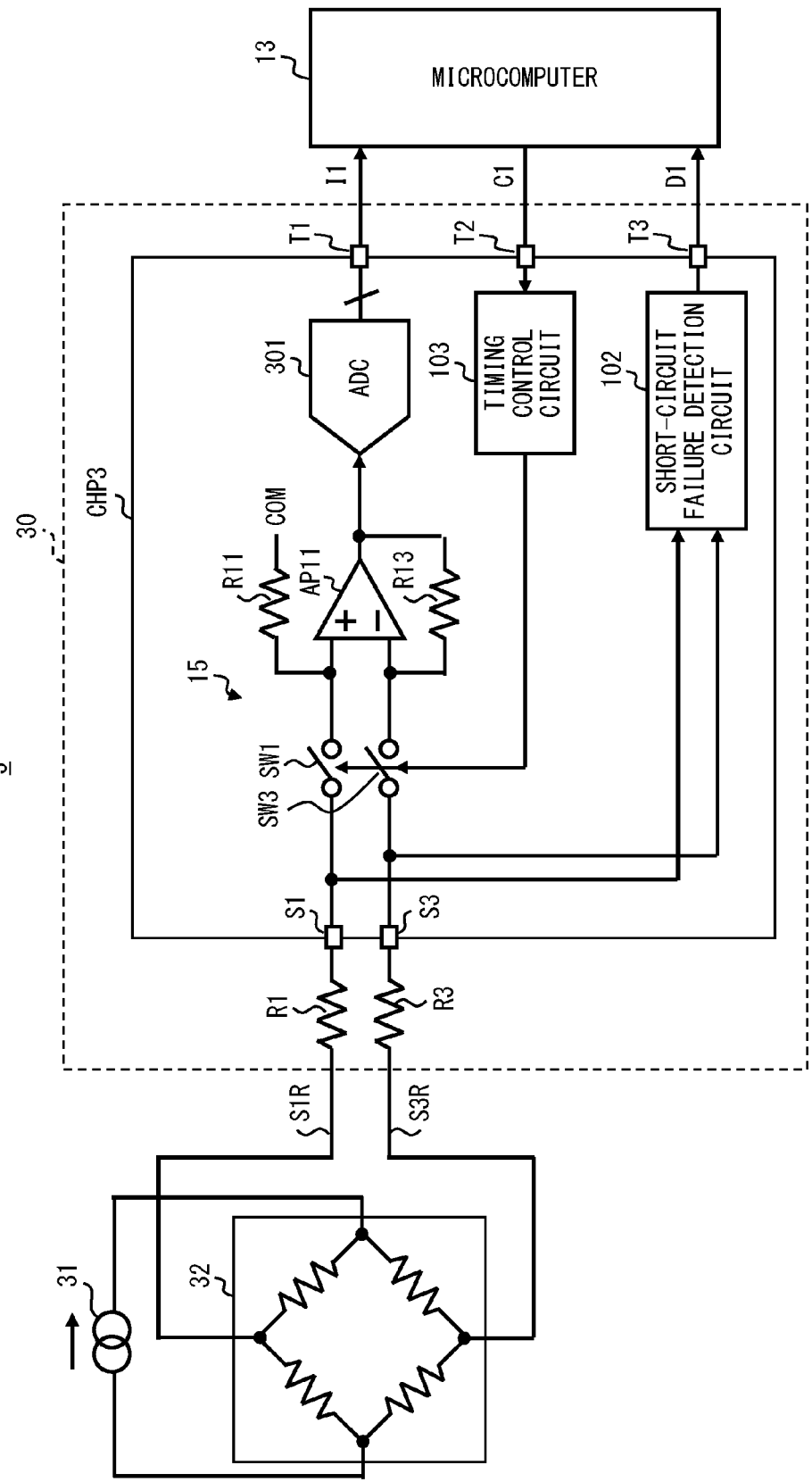
FIG. 9 shows a configuration example of an electronic control system according to a third embodiment.

FIG. 9 shows a configuration example of an electronic control system 3 according to a third embodiment.

The electronic control system 3 is a pressure detection system using a semiconductor pressure sensor.

As shown in FIG. 9, the electronic control system 3 includes a bridge circuit 32 composed of a plurality of resistive elements including a pressure-sensing element, a constant-current source 31 that feeds a constant current to the bridge circuit 32, an AD converter 30, and a microcomputer 13. The constant-current source 31 and the bridge circuit 32 constitute a semiconductor pressure sensor (a detection device).

When a pressure is applied to the semiconductor pressure sensor, the resistance of the pressure-sensing element in the bridge circuit 32 changes according to that pressure. As a result, the bridge circuit 32 outputs voltage signals having levels that change according to the pressure from its ends S1R and S3R. The AD converter 30 convers a detection result (an analog signal) of the semiconductor pressure sensor into a digital signal I1 and outputs the digital signal I1. Further, the AD converter 30 detects the presence/absence of a short-circuit failure in the semiconductor pressure sensor and outputs a result of the detection as a detection result D1. The microcomputer 13 performs a predetermined process based on the digital signal I1, which contains the pressure information output from the AD converter 30. Further, when a short-circuit failure in the semiconductor pressure sensor is detected by the AD converter 30, the microcomputer 13 performs a process for stopping the operation of the semiconductor pressure sensor or the like.

The AD converter 30 includes, among all the components of the RD converter 10, an amplifier circuit 15, a short-circuit failure detection circuit 102, a timing control circuit 103, and switches SW1 and SW3. Further, the AD converter 30 includes an AD converter 301 in place of the angle calculation circuit 101. The AD converter 301 converts an output signal of the amplifier circuit 15 (a signal obtained by amplifying a voltage signal output from the semiconductor pressure sensor) into a digital signal I1 and outputs the digital signal I1. Note that a chip CHP3 corresponds to the chip CHP1. The rest of the operations of the AD converter 30 is basically similar to those of the amplifier circuit 15, the short-circuit failure detection circuit 102, the timing control circuit 103, and the switches SW1 and SW3 in the RD converter 10, and therefore its explanation is omitted.

The AD converter 30 and the electronic control system 3 including the AD converter 30 according to this embodiment disconnect the external terminals S1 and S3 from the operational amplifier AP11 in the short-circuit failure detection mode and then detect the presence/absence of a short-circuit failure in the semiconductor pressure sensor by using the potentials of the external terminals S1 and S3. As a result, the AD converter 30 and the electronic control system 3 including the AD converter 30 according to this embodiment can accurately detect the presence/absence of a short-circuit failure in the semiconductor pressure sensor without using the potential of a dedicated external terminal and hence prevent the increase in the circuit size.

As described above, a converter and an electronic control system including the converter according to any of the above-described first to third embodiments disconnect an existing external terminal(s) disposed on a chip in which the converter is formed from an operational amplifier(s) in a short-circuit failure detection mode and then detect the presence/absence of a short-circuit failure in a detection device by using the existing external terminal(s). As a result, the converter and the electronic control system including the converter according to any of the above-described first to third embodiments can accurately detect the presence/absence of a short-circuit failure in the detection device without using the potential of a dedicated external terminal and hence prevent the increase in the circuit size.

The present invention made by the inventors has been explained above in a specific manner based on embodiments. However, the present invention is not limited to the above-described embodiments, and needless to say, various modifications can be made without departing from the spirit and scope of the present invention.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An electronic control system comprising:
first and second terminals to which one of a pair of voltage signals and the other of the pair of voltage signals are supplied through first and second input resistances, respectively, the pair of voltage signals being signals that change according to a detection result of an externally-provided detection device;
an operation amplifier configured to amplify a potential difference between the pair of the voltage signals supplied to the first and second terminals;
a first feedback resistance disposed between an output terminal of the operation amplifier and one of two input terminals thereof;

first and second switches disposed between the two input terminals of the operation amplifier and the first and second terminals, respectively;

a short-circuit failure detection circuit configured to detect whether or not a short-circuit failure has occurred in the detection device based on a voltage level of each of the first and second terminals in a state where the first and second switches are in an off-state;

a first resistive element disposed between a node on a signal line between the first switch and connected to the first terminal and a high-potential side power supply terminal to which a power supply voltage is supplied; and a second resistive element disposed between a node on a signal line between the first switch and connected to the second terminal and a low-potential side power supply terminal to which a reference voltage is supplied.

2. The electronic control system according to claim 1, wherein an intermediate voltage higher than a reference voltage and lower than a power supply voltage is supplied to the other input terminal of the operational amplifier.

3. The electronic control system according to claim 1, wherein the detection device is a resolver.

4. The electronic control system according to claim 3, further comprising an angle calculation circuit configured to convert an output signal of the operational amplifier representing a rotation angle of a rotor detected by the resolver into a digital signal and output the digital signal, wherein
the angle calculation circuit adjusts a value of the digital signal by using a control signal having a pulse waveform having a duty ratio that changes according to a difference between the rotation angle represented by the digital signal and the rotation angle represented by the output signal of the operational amplifier so that the rotation angle represented by the digital signal becomes equal to the rotation angle represented by the output signal of the operational amplifier.

5. The s electronic control system according to claim 4, wherein the angle calculation circuit keeps the value of the digital signal at a constant value by using a clock signal having a duty ratio of 50% as a substitute for the control signal in a state where the first and second switches are in an off-state.

6. A semiconductor device comprising:

first and second terminals to which one of a pair of voltage signals and the other of the pair of voltage signals are supplied through first and second input resistances, respectively, the pair of voltage signals being signals that change according to a detection result of an externally-provided detection device;

an operation amplifier configured to amplify a potential difference between the pair of the voltage signals supplied to the first and second terminals;

a first feedback resistance disposed between an output terminal of the operation amplifier and one of two input terminals thereof;

first and second switches disposed between the two input terminals of the operation amplifier and the first and second terminals, respectively;

a short-circuit failure detection circuit configured to detect whether or not a short-circuit failure has occurred in the detection device based on a voltage level of each of the first and second terminals in a state where the first and second switches are in an off-state;

a first resistive element disposed between a node on a signal line between the first terminal and one end of the first switch and a high-potential side power supply terminal to which a power supply voltage is supplied; and a second resistive element disposed between a node on a signal line between the second terminal and one end of the second switch and a low-potential side power supply terminal to which a reference voltage is supplied.

7. A semiconductor device comprising:

first and second terminals to which one of a pair of voltage signals and the other of the pair of voltage signals are supplied through first and second input resistances, respectively, the pair of voltage signals being signals that change according to a detection result of an externally-provided detection device;

a first switch, one end of the first switch being connected to the first external terminal;

a second switch, one end of the second switch being connected to the second external terminal;

an operation amplifier comprising a first input terminal connected to another end of the first switch and a second input terminal connected to another end of the second switch;

a feedback resistance disposed between an output terminal of the operation amplifier and the another end of the first switch;

an abnormality detection circuit configured to detect an abnormality of a signal supplied to the first external terminal based on a voltage level of the signal supplied to the first external terminal in a period in which the first switch is in an off-state;

a first resistive element disposed between a node on a signal line between the first external terminal and one end of the first switch and a high-potential side power supply terminal to which a power supply voltage is supplied; and a second resistive element disposed between a node on a signal line between the second external terminal and one end of the second switch and a low-potential side power supply terminal to which a reference voltage is supplied.

8. The semiconductor device according to claim 7, wherein the abnormality detection circuit further detects an abnormality of a signal supplied to the second external terminal based on a voltage level of the signal supplied to the second external terminal in a period in which both of the first and second switches are in an off-state.

9. The semiconductor device according to claim 7, wherein an intermediate voltage higher than a reference voltage and lower than a power supply voltage is supplied to the second input terminal of the operational amplifier.

10. The semiconductor device according to claim 7, further comprising an angle calculation circuit configured to convert an output signal of the operational amplifier into a digital signal and outputs the digital signal, wherein
the angle calculation circuit adjusts a value of the digital signal by using a control signal having a pulse waveform having a duty ratio that changes according to a difference between a rotation angle represented by the digital signal and a rotation angle represented by the output signal of the operational amplifier so that the rotation angle represented by the digital signal becomes equal to the rotation angle represented by the output signal of the operational amplifier.

11. The semiconductor device according to claim 10, wherein the angle calculation circuit keeps the value of the digital signal at a constant value by using a clock signal having a duty ratio of 50% as a substitute for the control signal in a state where the first and second switches are in an off-state.

\* \* \* \* \*